United States Patent
Wang

(10) Patent No.: US 10,615,364 B2
(45) Date of Patent: Apr. 7, 2020

(54) DISPLAY PANEL AND MANUFACTURING METHOD THEREOF

(71) Applicant: BOE TECHNOLOGY GROUP CO., LTD., Beijing (CN)

(72) Inventor: Wei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/988,327

(22) Filed: May 24, 2018

(65) Prior Publication Data

US 2019/0097162 A1 Mar. 28, 2019

(30) Foreign Application Priority Data

Sep. 27, 2017 (CN) .......................... 2017 1 0892083

(51) Int. Cl.
| | | |
|---|---|---|
| H01L 51/52 | (2006.01) | |
| H01L 27/32 | (2006.01) | |
| H01L 51/56 | (2006.01) | |
| H01L 51/00 | (2006.01) | |

(52) U.S. Cl.
CPC ........ H01L 51/524 (2013.01); H01L 27/3246 (2013.01); H01L 27/3262 (2013.01); H01L 51/0031 (2013.01); H01L 51/0096 (2013.01); H01L 51/5206 (2013.01); H01L 51/5221 (2013.01); H01L 51/5253 (2013.01); H01L 51/56 (2013.01); H01L 2251/301 (2013.01); H01L 2251/56 (2013.01)

(58) Field of Classification Search
CPC ........................ H01L 51/0031; H01L 51/5253
See application file for complete search history.

(56) References Cited

U.S. PATENT DOCUMENTS

| | | |
|---|---|---|
| 9,171,497 B2 | 10/2015 | Zeng |
| 9,551,678 B2 | 1/2017 | Suzuki |
| 9,917,254 B2 | 3/2018 | Luo et al. |
| 10,026,793 B2 | 7/2018 | Jeon |
| 10,078,976 B2 | 9/2018 | Nam et al. |
| 10,381,603 B2 | 8/2019 | Xu et al. |
| 2010/0294024 A1 | 11/2010 | Kumar et al. |
| 2015/0185142 A1 | 7/2015 | Zeng et al. |

(Continued)

FOREIGN PATENT DOCUMENTS

| | | |
|---|---|---|
| CN | 101632010 A | 1/2010 |
| CN | 103217459 A | 7/2013 |

(Continued)

OTHER PUBLICATIONS

Chinese Office Action in Chinese Application No. 201710892083.3, dated Oct. 30, 2019 with English translation.

*Primary Examiner* — Walter H Swanson
(74) *Attorney, Agent, or Firm* — Collard & Roe, P.C.

(57) ABSTRACT

A display panel includes a substrate which includes a display region and a non-display region. The display panel further includes a plurality of OLED cells provided in the display region; a monitoring electrode provided in the non-display region, the monitoring electrode being capable of reacting with water and/or oxygen so that the resistance thereof changes; and a thin film encapsulation layer at least covering the display region and the monitoring electrode. A manufacturing method of the display panel is also provided.

11 Claims, 4 Drawing Sheets

(56) References Cited

U.S. PATENT DOCUMENTS

2015/0325810 A1* 11/2015 Iwase ................... H01L 51/524
                                                         257/40
2018/0226607 A1    8/2018 Li et al.

FOREIGN PATENT DOCUMENTS

| CN | 103730071 A | 4/2014 |
| CN | 105185806 A | 12/2015 |
| CN | 105280675 A | 1/2016 |
| CN | 105355645 A | 2/2016 |
| CN | 105679961 A | 6/2016 |
| CN | 105895827 A | 8/2016 |
| CN | 106024842 A | 10/2016 |
| CN | 106057853 A | 10/2016 |
| CN | 107195249 A | 9/2017 |

\* cited by examiner

DISPLAY PANEL AND MANUFACTURING METHOD THEREOF

The present disclosure claims priority of Chinese Patent Application No. 201710892083.3 filed on Sep. 27, 2017, the disclosure of which is hereby entirely incorporated by reference as a part of the present disclosure.

TECHNICAL FIELD

Embodiments of the present disclosure relate to a display panel and a manufacturing method thereof.

BACKGROUND

Organic Light-Emitting Display (OLED) devices are rapidly emerging in the display field because of their advantages of being ultra-thin, having low power consumption, high brightness, high luminous efficiency, and being applicable to flexible display or the like. But, a disadvantage of having a short service life has always hampered their development. Erosion of water and oxygen against OLED devices is the main cause that affects their service life. On one hand, the cathode of an OLED device is usually made of a chemically active metal, which is prone to electrochemical corrosion in water-oxygen environments and causes failure of the device. On the other hand, the light emitting functional layer in the OLED device is easily oxidized by oxygen, and the carbonyl compound generated by the oxidation reaction is an effective quencher, which reduces the light emitting quantum efficiency of the OLED device. At the same time, water vapor may lead to hydrolysis of the organic layer compounds in the OLED device, which reduces the conductivity and results in greatly shortened lifetime of the device.

Since OLED devices are extremely susceptible to erosion of water and oxygen, it is strictly required that the OLED devices should be separated from water and oxygen in the environment to prolong the service life of the OLED devices. In the related art, the surface of the OLED device is generally covered by a thin film encapsulation (TFE) layer to have it isolated from water and oxygen.

SUMMARY

At least one embodiment of the present disclosure provides a display panel, comprising a substrate which comprises a display region and a non-display region, and further comprising an OLED cell provided in the display region; a monitoring electrode provided within the non-display region, the monitoring electrode being capable of reacting with water and/or oxygen so that the resistance thereof changes; and a thin film encapsulation layer at least covering the display region and the monitoring electrode.

At least one embodiment of the present disclosure provides a method of manufacturing the display panel as described above, comprising: forming an OLED cell within the display region of the substrate and forming a monitoring electrode in the non-display region, the monitoring electrode is provided to react with water and/or oxygen so that the resistance thereof changes; and forming a thin film encapsulation layer which at least covers the display region and the monitoring electrode.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

REFERENCE NUMERALS

Figure 1:
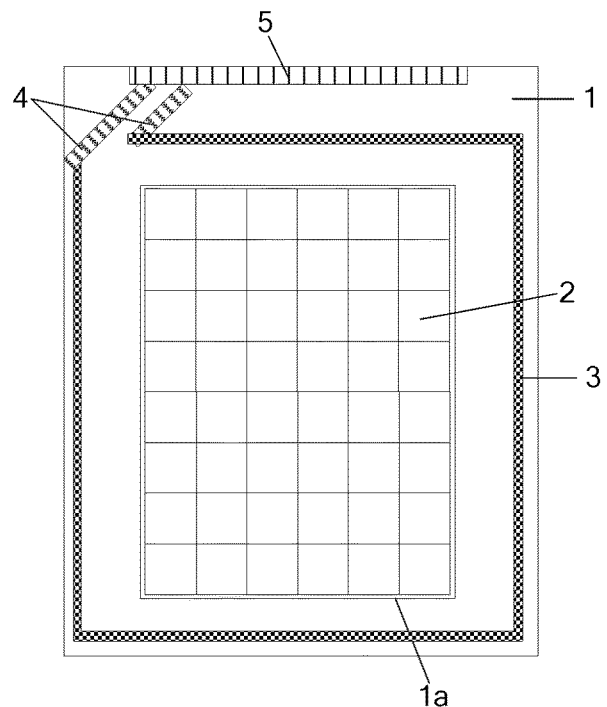
FIG. 1 is an illustrative structural top view of a display panel according to an embodiment of the present disclosure.

1—substrate;
10—base substrate;
11—planarization layer
1a—display region;
2—OLED cell;
21—anode;
21a—remaining pattern;
22—light emitting functional layer;
23—cathode;
3—monitoring electrode (monitoring ring);
31—metallic electrode;
32—connecting electrode;
4—test lead;
5—binding electrode;
6—annular barrier dam;
7—pixel defining layer;
8—thin film encapsulation layer;
81—first inorganic thin film layer;
82—organic thin film layer;
83—second inorganic thin film layer;
90—signal line;
91—auxiliary barrier dam;
92—buffer layer;
93—gate insulation layer;
94—interlayer insulation layer;
100—evaporation mask;
101—first opening area;
102—second opening area;
103—evaporation source.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

It should be noted that unless defined otherwise, all terms (including technical and scientific terms) used herein have the same meaning as commonly understood by those ordinary skilled in the art to which this disclosure pertains. It should also be understood that terms such as those defined in a typical dictionary should be construed as having a meaning that is consistent with their meaning in the context of the related art without being interpreted in an idealized or overly formal sense unless expressly defined so herein.

For example, terms of "first", "second" and the like used in the description and the claims of the present application are not intended to indicate sequences, amounts or degree of importance, but are only for purpose of distinguishing various components. Words of "including" or "comprising" and the like mean that an element or an article before them contains an element/elements or an article/articles listed thereafter, while not excluding other elements or articles. Terms of "upper/above", "lower/under" and etc. indicating orientation or positional relationship are based on the orientation or positional relationship illustrated in the drawings, and are merely for a simplified description of the technical solutions of the present disclosure, other than indicating or suggesting that the device or element referred to must have a particular orientation, be constructed and operated in a particular orientation, and therefore should not be construed as limiting the present disclosure.

After the encapsulation process of the OLED device is completed, it is difficult to detect whether the thin film encapsulation layer is damaged and monitor the encapsulation effect. Thus, it is impossible to effectively detect whether the sealing performance of the OLED display device is good, which fails to enable a more effective sealing protection for the OLED device.

As illustrated in FIG. 1, at least one embodiment of the present disclosure provides a display panel comprising a substrate 1 which comprises a display region 1a and non-display region 1b. The display panel further comprises a plurality of OLED cells 2 provided in the display region 1a; a monitoring electrode 3 provided on the substrate 1 and positioned within the non-display region 1b outside the display region 1a, wherein the monitoring electrode 3 can react with water and/or oxygen so that the resistance value thereof changes; and a thin film encapsulation layer (not illustrated) at least covering the display region 1a and the monitoring electrode 3.

It is to be noted that firstly the substrate is an array substrate formed with a thin film transistor array layer.

Secondly, a pattern of the monitoring electrode 3 is not limited to the ring shape having an opening as illustrated in FIG. 1 as long as it is provided in the non-display region 1b.

Thirdly, the thin film encapsulation layer is generally a pattern of a whole layer covering the display region 1a to seal and protect the underlying OLED cells 2 and extending to the non-display region 1b to further cover the monitoring electrode 3 provided in the non-display region 1b.

Fourthly, the monitoring electrode 3 is extremely sensitive to water and oxygen and undergoes oxidation and/or peeling fracture after being eroded by water and oxygen, resulting in a change in its resistance value.

Taking it as an example that the monitoring electrode 3 comprises monolithic Al (aluminum), after the thin film encapsulation layer is broken and there is a seal failure, air penetrates into the monitoring electrode 3, and then the resistance of monolithic Al rapidly increases as it reacts with air. This process usually takes only about 50 s, its resistance is increased from 1558Ω to 1946Ω, and the change rate of the resistance value is +24.9%, and then the change in the resistance value will gradually tend to be smooth. This is mainly because that Al is a metal having a very active chemical property. After being exposed to air, monolithic Al is rapidly oxidized by oxygen in the air to form a porous oxide, $Al_2O_3$, with an increased resistance. The reaction process is as follows:

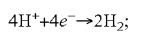

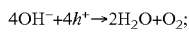

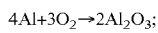

Based on the principle of change in the resistance value, after the preparation of the above-described display panel is completed, the resistance value of the monitoring electrode 3 can be monitored by a corresponding cell test device (Cell Test). After it is detected that the resistance value of the monitoring electrode 3 is changed from a set resistance value before the sealing of the thin film encapsulation layer (typically, the resistance of the monolithic metal is relatively small compared with its oxide, and the change is usually a rise in the resistance value), it can be determined that the package edge of the display panel is damaged and the sealing of the thin film encapsulation layer is ineffective, so that the thin film encapsulation layer can be repaired in time to prevent the defective product from entering the subsequent process. At the same time, a cell unit capable of monitoring the resistance value of the monitoring electrode 3 can also be added to the control chip bound to the display panel to monitor in real time whether the sealing performance of the display panel during use is effective or not.

Based on this, in the above-described display panel, by providing a monitoring electrode having a resistance value sensitive to water and oxygen in the non-display region of the substrate, after the resistance value of the monitoring electrode is changed, it can be indicated that the thin film encapsulation layer covering the display region of the substrate and the monitoring electrode is damaged. As the magnitude of the change in the resistance of the monitoring electrode increases, the extent to which the periphery of the display region in the display panel (usually the edge of the screen) is eroded by water and oxygen can be further indicated, thereby monitoring the lifetime of the OLED device in the entire display panel. That is to say, when it is detected that the entire periphery of the display region is eroded by water and oxygen, the lifetime of the entire screen can be predicted.

And, since the monitoring electrode is provided in the non-display region, after the thin film encapsulation layer is damaged, water and oxygen in the environment intrude into the display panel, and the resistance value changes after the monitoring electrode reacts with water and/or oxygen. That is to say, the material of the monitoring electrode is very sensitive to water and oxygen, and can absorb at least part of water and/or oxygen intruded into the interior of the display panel, which can prevent more water and oxygen from being intruded into the OLED cell located further inside the display panel, and thereby further protecting the OLED cell and prolonging the service life of the display panel.

Further, in order to achieve the effect of effectively monitoring the entire periphery of the display region, referring to FIG. 1, the monitoring electrode 3 is a monitoring ring 3 (i.e., a monitoring line) surrounding the display region 1*a*. The monitoring ring 3 is provided with an opening. The above-described display panel further comprises test leads 4 provided on the substrate 1 and connected to both ends of the opening respectively, wherein the test leads 4 are usually provided in the pad (wiring pad) area of the non-display region.

Here, the monitoring ring 3 is provided with the opening, and both ends of the opening are respectively connected with the test leads 4, so as to form a closed circuit for monitoring the change in resistance value of the monitoring ring through the test leads 4.

Further, the above-described display panel further comprises a binding electrode 5 connected to the test leads; and a chip bound to the binding electrode 5 for monitoring the change of the resistance value of the monitoring ring.

Here, the chip may be a circuit structure separately provided for monitoring the change in the resistance value of the above-described monitoring ring 3. Alternatively, the chip may also be a driving chip bound at the periphery of the display region 1*a* for controlling the display panel to perform display, in which a resistance measuring module is provided and is configured to measure the change of resistance value of the monitoring ring 3. The embodiment of the present disclosure does not limit the chip as long as it can measure the change of resistance value of the monitoring ring 3.

Further, the above-described display panel further comprises an annular barrier dam (not illustrated in FIG. 2) provided on the substrate 1 and surrounding the display region 1*a*.

Figure 3:
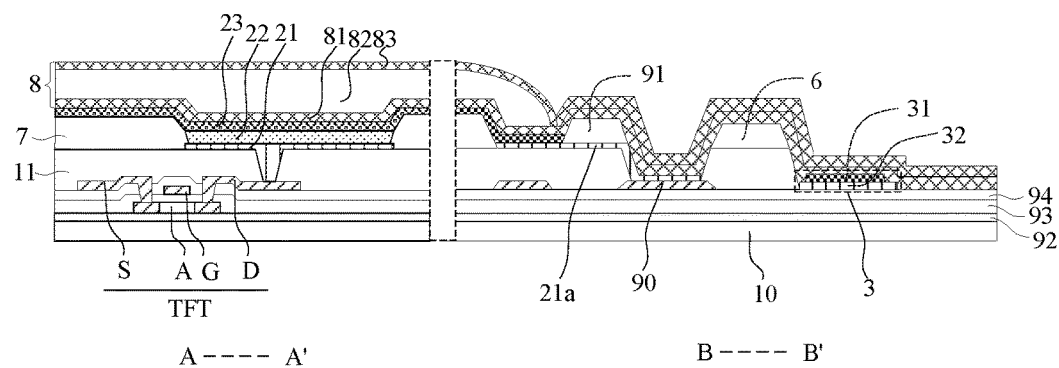
FIG. 3 is a first illustrative structural sectional view taken along the directions of A-A' and B-B' in FIG. 2.
Figure 4:
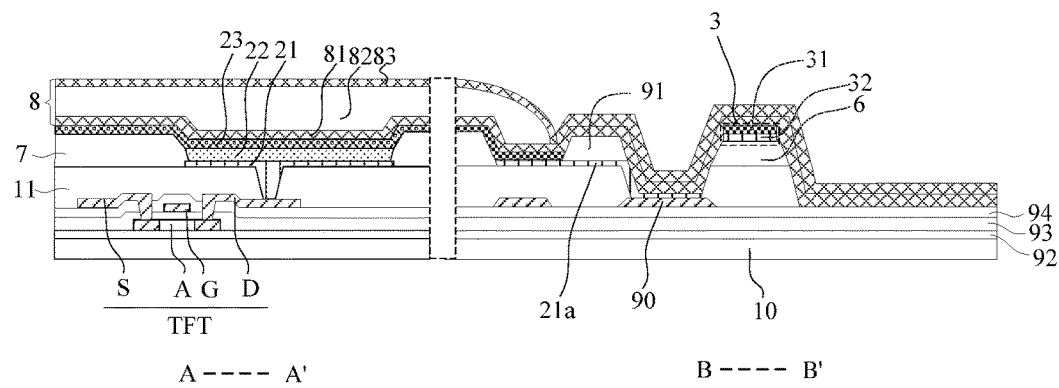
FIG. 4 is a second illustrative structural sectional view taken along the directions of A-A' and B-B' in FIG. 2.

The position of the monitoring ring 3 can be located on a side of the annular barrier dam 6 away from the display region 1*a* as illustrated in FIG. 3; or alternatively, the position of the monitoring ring 3 can be located on the annular barrier dam 6 as illustrated in FIG. 4.

Referring to FIG. 3 or FIG. 4, the substrate 1 in the above-described display panel comprises: a base substrate 10, a thin film transistor (indicated as TFT in the drawings) disposed above the base substrate 10, and a planarization layer 11 covering the TFT. The planarization layer 11 is provided with a via 20, through which the drain (indicated as D in the drawings) of the thin film transistor TFT is exposed. The thin film transistor TFT is positioned in the display region, and the planarization layer 11 is positioned in the display region and extends from the periphery of the display region to the non-display region. The OLED cell comprises an anode 21 and a light emitting functional layer 22 and a cathode 23 along a direction away from the base substrate 10. The anode 21 is disposed on the planarization layer 11 and is electrically connected to the drain D of the thin film transistor TFT through the via 20. The above-described display panel further comprises: a pixel defining layer 7 disposed on the planarization layer 11 and provided with a plurality of hollow regions, which at least correspond to a part of the anode 21. The light emitting functional layer 22 is located in the hollow region, and the cathode 23 is disposed on the light emitting functional layer 22. An edge portion of the pixel defining layer 7 on the planarization layer 11 away from the display region forms an annular barrier dam 6.

Firstly, it should be noted that the TFT comprises a gate (indicated as G in the drawings), an active layer (indicated as A in the drawings), a source (indicated as S in the drawings), and a drain D. The substrate 1 can of course further comprise structural layers such as a buffer layer 92, a gate insulating layer 93, and an interlayer insulating layer 94 and etc. When the base substrate 10 is a rigid substrate such as a glass substrate or a transparent flexible substrate such as PI (polyimide), the buffer layer can serve to isolate the glass substrate or the transparent flexible substrate and the active layer, and thereby preventing impurity ions in the glass substrate or the transparent flexible substrate from being migrated and doped into the active layer with influence of the temperature of the preparation process, and thus affecting the performance of the TFT.

Secondly, the light emitting functional layer 22 can further comprise structures such as a hole injection layer, a hole barrier layer, an electron injection layer, an electron barrier layer, and the like. Each layer can be made of organic small molecule materials or organic polymer materials, or can be made of inorganic materials or composite doping materials and the like.

Thirdly, since the cathodes 23 of the respective OLED cells receive the same signal, the cathodes 23 of the OLED cells are integrated as an integral layer structure covering the light emitting functional layers 22 of the OLED cells, so as to reduce the difficulty of signal loading for the cathodes 23, reduce the number of wiring traces in the display panel, and increase the aperture ratio of the display panel.

Referring to FIG. 3 or FIG. 4, the portion of the planarization layer 11 extending to the non-display region is generally provided with a via 30 exposing the underlying signal line 90. In the preparation of the anode, the remaining pattern 21*a* formed by the same patterning process as the anode partially covers the signal line 90, and the other portion contacts the cathode 23 at an edge extending to the outside of the display region to provide the signal on the signal line 90 to the cathode 23.

Fourthly, the thin film encapsulation layer 8 typically comprises a first inorganic thin film layer 81, an organic thin film layer 82 and a second inorganic thin film layer 83 sequentially away from the base substrate 10. The first inorganic thin film layer 81 and the second inorganic thin film layer 83 have an effect of isolating water and oxygen, and both cover the display region and extend to the outside of the display region to cover the annular barrier dam 6 and the monitoring ring 3. The organic thin film layer 82 has poor isolation effect against water and oxygen, and can be configured as a connecting wrap layer, thus it only covers the display region and extends to the edge of the display region, and does not cover the annular barrier dam 6 and the monitoring ring 3.

The first inorganic thin film layer 81 and the second inorganic thin film layer 83 are usually nitride and/or silicon oxide layers prepared by using a CVD (Chemical Vapor Deposition) process. The nitride and/or silicon oxide layers having a dense structure and a stable chemical property are used to achieve the isolation from water and oxygen in the air.

Fifthly, the edge portion of the pixel defining layer 7 on the planarization layer 11 away from the display region forms the annular barrier dam 6 (commonly referred to as Dam2). A portion 91 of the pixel defining layer 7 between the edge portion of the pixel defining layer 7 positioned on the planarization layer 11 away from the display region and the portion of the pixel defining layer 7 positioned within the display region can serve as an auxiliary barrier dam (commonly referred to as Dam1) to assist in blocking erosion of water and oxygen to the interior of the display panel.

The embodiments of the present disclosure do not limit the structures of the TFT, the buffer layer, the gate insulating layer, the interlayer insulating layer, the signal line, the barrier dam, and the like.

Referring to FIG. 3, the monitoring ring 3 can be disposed on a side of the annular barrier dam 6 away from the display region 1a, namely at the outside of the annular barrier dam 6. The side of the annular barrier dam 6 away from the display region 1a is close to a part of the CVD boundary of the inorganic layer in the thin film encapsulation layer. When water and oxygen start to infiltrate into the thin film encapsulation layer, the monitoring ring 3 located in this area can rapidly monitor the intrusion of water and oxygen, and determine in advance whether the panel fails or not, and thereby preventing defective products from flowing into subsequent processes.

Referring to FIG. 4, the monitoring ring 3 can also be arranged on the annular barrier dam 6. Since the Dam region is relatively high in position with respect to the remaining flat regions on the substrate 1, it is easy to be damaged due to contact with a mask (Mask) or the like used in the manufacturing process. Erosion of the water and oxygen is more likely to occur after the annular barrier dam 6 is damaged. Providing the monitoring ring 3 in this area can further monitor the damage on the barrier dam and enable a timely feedback of panel failure.

Figure 2:
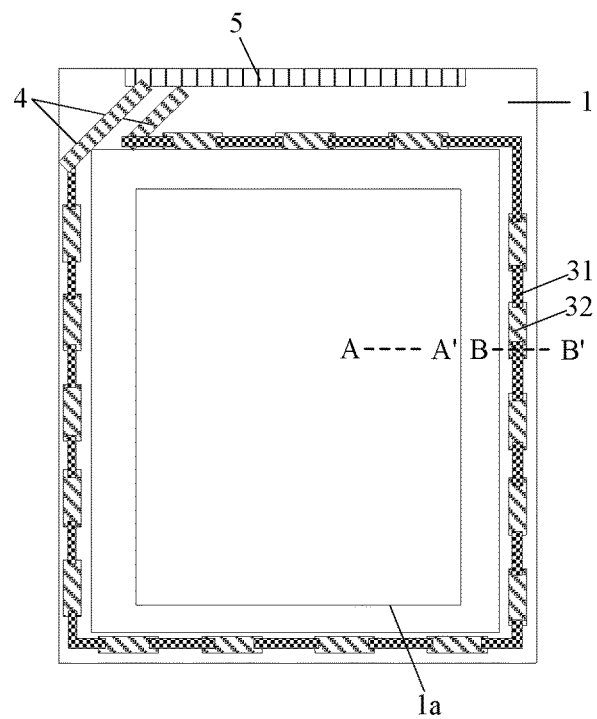
FIG. 2 is an illustrative structural top view of a display panel according to another embodiment of the present disclosure.

Based on the above, referring to FIG. 2, the monitoring ring comprises: a plurality of metallic electrodes 31 disposed in the periphery of the non-display region 1b, configured to surround the display region, wherein any two adjacent metallic electrodes 31 in the plurality of metallic electrodes 31 are spaced apart at intervals; a plurality of connecting electrodes 32 located in the non-display region 1b around the display region 1a, configured to electrically connect two adjacent metallic electrodes 31 spaced apart at intervals, so as to form the monitoring ring 3 provided with an opening; wherein material of the metallic electrode 31 is capable of reacting with water and/or oxygen so that its resistance value is changed.

Here, it is to be noted that the cathode material in the OLED cell is usually an active metal. In order to simplify the overall preparation process of the display panel, the above-described metallic electrode 31 and the cathode can be simultaneously formed through a single patterning process, namely, the material of the cathode is adopted to form the metallic electrode 31.

Since the cathode is an integral layer structure covering the entire display region and extending to the edges of the display region, an opening on the evaporation mask (Mask) for forming a cathode by the evaporation process which corresponds to a cathode to be formed is located in the middle of the evaporation mask. If the cathode and the above-described metallic electrode 31 are simultaneously formed through a single patterning process, due to the structure of the evaporation mask, the opening pattern corresponding to the evaporated metallic electrode 31 around the opening of the display region cannot be an annular structure connected together, otherwise the opening in the middle of the evaporation mask would not be supported. Therefore, the openings corresponding to the metallic electrodes 31 have to be spaced apart, thereby forming the above-mentioned plurality of spaced apart metallic electrodes 31 disposed in the non-display region and surrounding the display region.

Since the plurality of metallic electrodes 31 are spaced apart at intervals, in order to electrically connect the metallic electrodes 31 together, the above-mentioned monitoring ring further comprises a plurality of connecting electrodes 32 spaced apart, each of which is configured to electrically connect two adjacent metallic electrodes 31 which are spaced apart.

Relative to the substrate 1, the positions of the connecting electrodes 32 and the metallic electrodes 31 in the upper or in the lower are not limited, as long as the connecting electrodes 32 can electrically connect the spaced apart metallic electrodes 31 together.

For example, the connecting electrodes 32 can be disposed below the metallic electrodes 31. Both ends of the metallic electrode 31 can be overlapped on the connecting electrode 32 to ensure a good electrical connection therebetween.

The portions of the resultant monitoring ring 3 with the opening, which are at the ends of the opening, can be the metallic electrodes 31 and/or the connecting electrodes 32, which is not limited by the embodiments of the disclosure, as long as it is ensured that the monitoring ring 3 and the test lead 4 are connected.

Further, material for the metallic electrode 31 can be an active metal and/or a metal that is sensitive to water and oxygen, and for example comprises at least one of Mg (magnesium), Ga (gallium), K (potassium), Li (lithium), Al (aluminum) and Ag (silver).

The structure of the metallic electrode 31 can be one or more layers of metal elements, and each layer of the metal elements is any one of the above Mg, Ga, K, Li, Al, and Ag. Alternatively, the structure of the metallic electrode 31 can be one or more layers of alloys, and each layer of the alloy can be formed of at least two of the above Mg, Ga, K, Li, Al, and Ag. Or alternatively, the structure of the metallic electrode 31 can also be a laminated structure of the above metal element and alloy.

Further, in case that the monitoring ring is located on a side of the annular barrier dam away from the display region, the test leads and the connecting electrodes can be both disposed in the same layer as the drain of the thin film transistor and the source of the thin film transistor, and are made of the same material as the drain and the source, namely, formed through a single patterning process, so as to simplify the entire preparation process of the display panel.

Alternatively, the test leads can be disposed in the same layer as the drain of the thin film transistor and the source of the thin film transistor, and can be made of the same material as the source and the drain, namely, formed through a single patterning process; the connecting electrodes can be disposed in the same layer as the anode of the OLED cell, and can be made of the same material as the anode of the OLED cell, namely, formed through a single patterning process, so as to simplify the entire preparation process of the display panel.

Here, a typical patterning process refers to a process of using a mask once, exposing and developing of the photoresist on the film surface, etching the film exposed by the photoresist to form a specific pattern and removing the photoresist.

At least one embodiment of the present disclosure further provides a method for manufacturing the above-mentioned display panel, which comprises: forming an OLED cell in the display region and forming a monitoring electrode in the non-display region; the monitoring electrode can react with water and oxygen so as to make its resistance value changed; forming a thin film encapsulation layer at least covering the display region and the monitoring electrode.

Further, in order to improve monitoring efficiency, the monitoring electrode is formed as a monitoring ring surrounding the display region; the monitoring ring is provided with an opening; and the manufacturing method further comprises forming on the substrate test leads respectively connected to both ends of the opening.

Further, forming the monitoring electrode as a monitoring ring comprises: forming a plurality of connecting electrodes spaced apart at intervals in the non-display region; forming a plurality of metallic electrodes spaced apart at intervals in the non-display region; each of the plurality of connecting electrodes is configured to electrically connect two adjacent spaced-apart metallic electrodes of the plurality of metallic electrodes to form a monitoring ring provided with an opening and surrounding the display region; material for the metallic electrode is capable of interacting with water and/or oxygen so as to make its resistance value changed.

The OLED cell comprises an anode, a light-emitting functional layer and a cathode in a direction away from the substrate; the cathodes of the plurality of OLED cells are connected together; and the cathodes and the metallic electrodes are formed by a same evaporation process.

Figure 5:
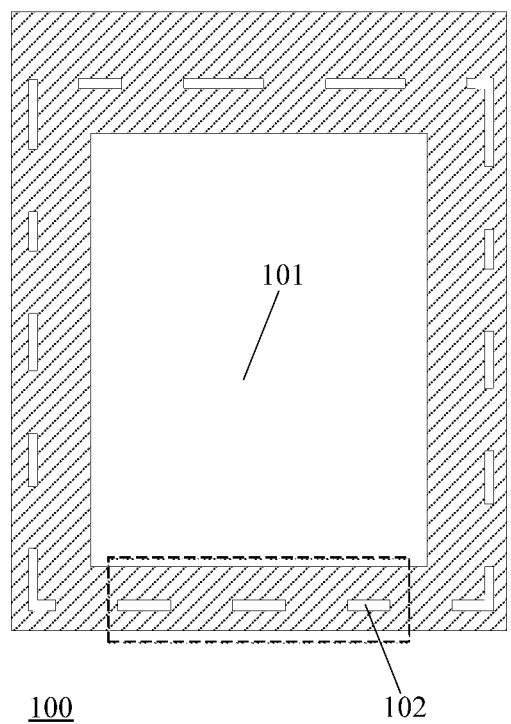
FIG. 5 is an illustrative structural top view of an evaporation mask in a method of manufacturing a display panel according to an embodiment of the present disclosure.
Figure 6:
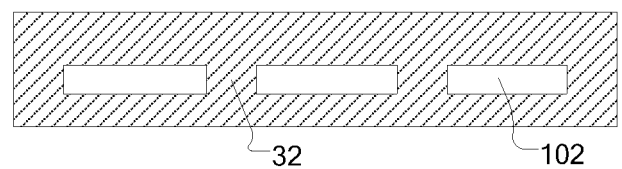
FIG. 6 is an enlarged schematic view of a portion in the dashed frame in FIG. 5.

As illustrated in FIG. 5 and FIG. 6, an evaporation mask 100 used in the evaporation process comprises a first opening area 101 and a plurality of second opening areas 102 surrounding the first opening area 101 and spaced apart from each other, wherein the first opening area 101 corresponds to the cathode formed in the display region, the second opening areas 102 correspond to the metallic electrodes formed in the non-display region.

Figure 7:
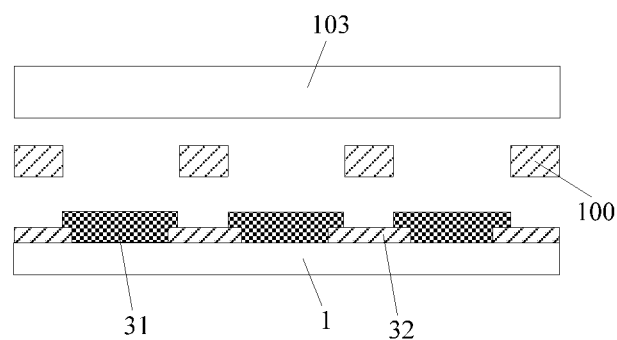
FIG. 7 is a schematic process view for evaporating a cathode and a metallic electrode in a method of manufacturing a display panel according to an embodiment of the present disclosure.

Thus, as illustrated in FIG. 7, metallic materials evaporated from the evaporation source 103 are deposited onto the substrate respectively through the first opening area 101 and the plurality of spaced-apart second opening areas 102 to form a cathode and a plurality of metallic electrodes 31 spaced apart at intervals.

Referring to FIG. 7, interval areas between the second opening areas 102 corresponds to the connecting electrode 32. Both ends of the deposited metallic electrode 31 can be overlapped on the connecting electrode 32.

Forming a substrate comprises: forming a thin film transistor on a base substrate and forming a planarization layer on the thin film transistor; forming a via in the planarization layer and exposing the via with the drain of the thin film transistor exposed; the thin film transistor being located in the display region, and the planarization layer being located in the display region and extending to the non-display region around the display region. Forming a plurality of OLED cells within the display region of the substrate and forming a monitoring electrode in the non-display region outside the display region further comprise forming an anode of the OLED cell on the planarization layer, the anode being connected to the drain of the thin film transistor through the via in the planarization layer, forming a pixel defining layer on the planarization layer; forming a plurality of hollow regions in the pixel defining layer, and the plurality of hollow regions exposing at least a part of the anode; forming a light emitting functional layer in each of the plurality of hollow regions and forming a cathode on the light emitting functional layer; an edge of the pixel defining layer on the planarization layer away from the display region forming an annular barrier dam; the monitoring ring being located on a side of the annular barrier dam away from the display region, or the monitoring ring being located on the annular barrier dam.

In case that the monitoring ring is located on a side of the annular barrier dam away from the display region, the test leads and the connecting electrodes can be both disposed in the same layer as the drain of the thin film transistor and the source of the thin film transistor, and are made of the same material as the source and the drain, namely, formed through a single patterning process, so as to simplify the entire preparation process of the display panel.

Alternatively, the test leads can be disposed in the same layer as the drain of the thin film transistor and the source of the thin film transistor, and can be made of the same material as the source and the drain, namely, formed through a single patterning process; the connecting electrodes can be disposed in the same layer as the anode of the OLED cell, and can be made of the same material as the anode of the OLED cell, namely, formed through a single patterning process, so as to simplify the entire preparation process of the display panel.

Figure 8:
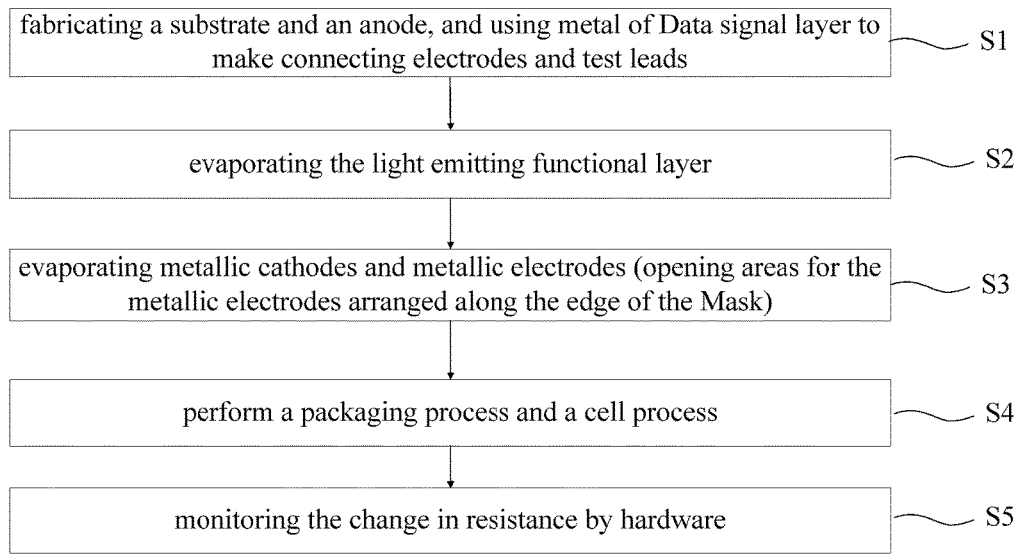
FIG. 8 is a process flow chart of a method of manufacturing a display panel according to an embodiment of the present disclosure.

Next, a process flow is provided by taking it as an example that the monitoring ring is located on a side of the annular barrier dam away from the display region. As illustrated in FIG. 8, the process flow of the above-described display panel is as follows.

Step S1: fabricating a substrate and an anode, and using metal of Data signal layer to make connecting electrodes and test leads.

The above-mentioned substrate is an array substrate (Array). The metal of Data layer forms a metal layer comprising a structure such as a data line, a source and a drain of a TFT. When the gate of the TFT is positioned above the source and the drain with respect to the base substrate, the above-described test leads can be fabricated by a gate metal (metal of Gate layer).

By the above Step S1, an anode disposed within the display region of the substrate and corresponding to each OLED cell, a plurality of connecting electrodes located around the display region and spaced apart at intervals, and test leads leading to the Pad area are formed.

And then, a pixel defining layer can be formed on the substrate, and a hollow region of the pixel defining layer exposes at least a part of the underlying anode 21.

Step S2: evaporating the light emitting functional layer.

The process can follow the processes in related technologies and will not be elaborated here.

Step S3: evaporating metallic cathodes and metallic electrodes (opening areas for the metallic electrodes arranged along the edge of the Mask).

As for the evaporation process, FIG. 5 to FIG. 7 can be refereed to. The detailed description is omitted here.

Through Step S1 and Step S3 described above, a monitoring ring with an opening formed of a metallic electrode and a connecting electrode serving as an overlapped electrode is formed. Both ends of the opening of the monitoring ring are respectively connected to the test leads to monitor the change in the resistance value of the monitoring ring.

Step S4: perform a packaging process and a cell process.

The thin film encapsulation layer at least covers the display regions and the monitoring ring. Other processes of the cell such as binding can use the technology in the related art and will not be elaborated here.

Step S5: monitoring the change in resistance by hardware.

Based on the principle of change in the resistance value, after the preparation of the above-described display panel is completed (i.e., after a flow sheet is prepared), the resistance value of the monitoring electrode 3 can be monitored by a corresponding cell test device (Cell Test). After it is detected that the resistance value of the monitoring ring is changed from a set resistance value before the sealing of the thin film encapsulation layer, it can be determined that the package edge of the display panel is damaged and the sealing of the thin film encapsulation layer is ineffective, so that the thin film encapsulation layer can be repaired to prevent the defective product from entering the subsequent process. At the same time, a cell unit capable of monitoring the resistance value of the monitoring ring can also be added to the control chip bound to the display panel to monitor in real time the sealing performance of the display panel during subsequent use.

The foregoing are merely exemplary embodiments of the disclosure, but are not used to limit the protection scope of the disclosure. The protection scope of the disclosure shall be defined by the attached claims.

The invention claimed is:

1. A display panel, comprising a substrate which comprises a display region and a non-display region, and further comprising an OLED cell provided in the display region, wherein the display panel further comprises: a monitoring electrode provided within the non-display region, the monitoring electrode being capable of reacting with water and/or oxygen so that the resistance thereof changes; and a thin film encapsulation layer at least covering the display region and the monitoring electrode, wherein the monitoring electrode is provided as a monitoring ring with an opening thereon, the monitoring ring is arranged to surround the display region; the display panel further comprises a test lead provided on the substrate and connected to both ends of the opening respectively, wherein the display panel further comprises an annular barrier dam provided on the substrate and surrounding the display region; the monitoring ring is located on a side of the annular barrier dam away from the display region, or, the monitoring ring is located on the annular barrier dam.

2. The display panel according to claim 1, wherein the monitoring ring comprises:
   a plurality of metallic electrodes spaced apart; and
   a plurality of connecting electrodes, each of which is configured to connect together two adjacent metallic electrodes spaced apart, so as to form the monitoring ring provided with the opening;
   wherein a material for the metallic electrodes is capable of reacting with water and/or oxygen so as to make its resistance value change.

3. The display panel according to claim 2, wherein the metallic electrodes are formed into a structure of one or more layers, and the material thereof comprises at least one of Mg, Ga, K, Li, Al, and Ag.

4. The display panel according to claim 1, further comprising a thin film transistor provided in the display region and a planarization layer providing on the thin film transistor and extending to the non-display region, the planarization layer being provided with a via, through which a drain of the thin film transistor is exposed;
   wherein the OLED cell comprises an anode, a light emitting functional layer, and a cathode which are sequentially away from the substrate; the anode is disposed on the planarization layer and is electrically connected to the drain of the thin film transistor through the via;
   the display panel further comprises a pixel defining layer disposed on the planarization layer and having a hollow region; the hollow region corresponds to at least a part of the anode; and the light emitting functional layer is located in the hollow region; and
   an edge portion of the pixel defining layer on the planarization layer away from the display region forms the annular barrier dam.

5. The display panel according to claim 1, wherein the thin film encapsulation layer comprises a first inorganic thin film layer, an organic thin film layer and a second inorganic thin film layer which are sequentially away from the substrate;
   wherein the first inorganic thin film layer and the second inorganic thin film layer both cover the display region and extend to the non-display region so as to cover the annular barrier dam and the monitoring ring; and
   the organic thin film layer covers the display region and extends to an edge of the display region.

6. A method of manufacturing the display panel according to claim 1, comprising: forming the OLED cell within the display region of the substrate and forming the monitoring electrode in the non-display region, the monitoring electrode is provided to react with water and/or oxygen so that the resistance thereof changes; and forming the thin film encapsulation layer which at least covers the display region and the monitoring electrode wherein the monitoring electrode is provided as a monitoring ring with an opening thereon, the monitoring ring is arranged to surround the display region; the display panel further comprises a test lead provided on the substrate and connected to both ends of the opening respectively, wherein the display panel further comprises an annular barrier dam provided on the substrate and surrounding the display region; the monitoring ring is located on a side of the annular barrier dam away from the display region, or, the monitoring ring is located on the annular barrier dam.

7. The method according to claim 6, wherein forming the monitoring electrode comprises:
   forming a plurality of connecting electrodes spaced apart around the display region;
   forming a plurality of metallic electrodes spaced apart around the display region;
   the plurality of metallic electrodes spaced apart are connected together by the plurality of connecting electrodes spaced apart so as to form a monitoring ring provided with an opening;
   wherein a material for the metallic electrodes is capable of interacting with water and/or oxygen so as to make its resistance value change.

8. The method according to claim 7, further comprising forming on the substrate a test lead connected with both ends of the opening respectively.

9. The method according to claim 6, wherein forming the OLED cell within the display region of the substrate comprises:
   forming a plurality of OLED cells within the display region, and sequentially forming an anode, a light emitting functional layer and a cathode of the plurality of OLED cells;
   wherein the cathode and a metallic electrode are formed through a single evaporation process and the cathodes of the plurality of OLED cells are integrally formed.

10. The method according to claim 9, wherein an evaporation mask used in the evaporation process comprises a first opening area and a plurality of second opening areas surrounding the first opening area and spaced apart,
   metallic materials evaporated from an evaporation source are deposited onto the substrate respectively through the first opening area and the plurality of second opening areas spaced apart at intervals to form the cathode and a plurality of metallic electrodes spaced apart at intervals.

11. The method according to claim 7, further comprising forming a thin film transistor within the display region and forming on the thin film transistor a planarization layer extending around the display region; forming in the planarization layer a via exposing a drain of the thin film transistor;

forming the OLED cell within the display region of the substrate and forming the monitoring electrode in the non-display region further comprise:

forming an anode and a pixel defining layer on the planarization layer; forming in the pixel defining layer a plurality of hollow regions which expose at least a part of the anode; the anode being electrically connected to the drain of the thin film transistor through the via, forming a light emitting functional layer in the hollow regions and forming a cathode on the light emitting functional layer; an edge of the pixel defining layer on the planarization layer away from the display region forming an annular barrier dam;

the monitoring ring being located on a side of the annular barrier dam away from the display region, or the monitoring ring being located on the annular barrier dam;

wherein in case that the monitoring ring is located on a side of the annular barrier dam away from the display region, a test lead and the connecting electrodes are both formed through a single patterning process together with the drain of the thin film transistor and a source of the thin film transistor, or the test lead is formed through a single patterning process together with the drain of the thin film transistor and the source of the thin film transistor, and the connecting electrodes are formed through a single patterning process together with the anode.

* * * * *